(12) United States Patent
Takeda et al.

(10) Patent No.: US 7,829,903 B2
(45) Date of Patent: Nov. 9, 2010

(54) LIGHT EMITTING APPARATUS

(75) Inventors: Hitoshi Takeda, Shizuoka (JP); Masayasu Ito, Shizuoka (JP); Tsukasa Tokida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 11/362,687

(22) Filed: Feb. 27, 2006

(65) Prior Publication Data

US 2006/0197444 A1 Sep. 7, 2006

(30) Foreign Application Priority Data

Mar. 3, 2005 (JP) .............................. 2005-059548

(51) Int. Cl.
*H01L 29/201* (2006.01)
(52) U.S. Cl. ............ 257/98; 257/E33.001; 257/E31.099
(58) Field of Classification Search .................... 257/98, 257/79, 81, 88, 89, 99, 100, 690–693, 700, 257/712; 438/22, 23, 26–29, 116, 125
See application file for complete search history.

(56) References Cited

U.S. PATENT DOCUMENTS

| | | | | |
|---|---|---|---|---|
| 5,632,029 | A * | 5/1997 | Bruce et al. ................. | 710/305 |
| 5,917,707 | A * | 6/1999 | Khandros et al. ........... | 361/776 |
| 6,731,077 | B1 | 5/2004 | Cheng | |
| 6,803,607 | B1 * | 10/2004 | Chan et al. ..................... | 257/98 |
| 7,038,195 | B2 * | 5/2006 | Kida et al. ................... | 250/239 |
| 7,238,967 | B2 * | 7/2007 | Kuwabara et al. ............. | 257/98 |
| 2002/0163006 | A1 * | 11/2002 | Yoganandan et al. .......... | 257/81 |
| 2004/0222433 | A1 * | 11/2004 | Mazzochette et al. ......... | 257/99 |
| 2005/0040421 | A1 * | 2/2005 | Wu .............................. | 257/99 |
| 2005/0239227 | A1 * | 10/2005 | Aanegola et al. ............. | 438/26 |
| 2006/0022214 | A1 * | 2/2006 | Morgan et al. ................ | 257/99 |
| 2006/0261364 | A1 * | 11/2006 | Suehiro et al. ............... | 257/100 |
| 2007/0114547 | A1 * | 5/2007 | Fujita et al. ................... | 257/98 |

FOREIGN PATENT DOCUMENTS

| | | |
|---|---|---|
| JP | 59-9982 | 1/1984 |
| JP | 62-104957 | 7/1987 |
| JP | 2-50854 | 2/1990 |
| JP | 05-283742 | 10/1993 |
| JP | 6-25874 | 4/1994 |

(Continued)

OTHER PUBLICATIONS

Patent Abstracts of Japan, Publication No. 2004-253364, Publication Date: Sep. 9, 2004, 1 page.

(Continued)

*Primary Examiner*—Kenneth A Parker
*Assistant Examiner*—Paul E Patton
(74) *Attorney, Agent, or Firm*—Osha Liang LLP (57) ABSTRACT

A light emitting apparatus includes a semiconductor light emitting element mounted on a circuit board; a lighting circuit part mounted on the circuit board; and a cover which covers the semiconductor light emitting element and the lighting circuit part. The lighting circuit part converts a voltage inputted from a power source into electromagnetic energy and propagates the converted electromagnetic energy to the semiconductor light emitting element as light emitting energy, and the cover transmits light from the semiconductor light emitting element.

9 Claims, 6 Drawing Sheets

FOREIGN PATENT DOCUMENTS

| JP | 6-38268 | 5/1994 |
|---|---|---|
| JP | 7-214820 | 8/1995 |
| JP | 8-172220 | 7/1996 |
| JP | 2003-174199 | 6/2003 |
| JP | 2004-253364 | 9/2004 |

OTHER PUBLICATIONS

Patent Abstracts of Japan for Patent Application No. 59-9982, Publication Date: Jan. 19, 1984, 1 page.

German Office Action for patent application No. 10 2006 009 930.3-33, Mailed Jan. 7, 2008, and English translation thereof, 11 pages.

Japanese Notification of Reasons for Refusal for Patent Application No. 2005-059548, Dated Jul. 20, 2010, English translation thereof 16 pages.

via espacenet, Japanese Abstract, Publication No. JP 8-172220, dated Jul. 2, 1996, 1 page.

via espacenet, Japanese abstract, Publication No. 7-214820, dated Aug. 15, 1995, 1 page.

via espacenet, Japanese abstract, Publication No. 2003-174199, dated Jun. 20, 2003, 1 page.

Patent abstracts of Japan, Publication No. 02-050854, dated Feb. 20, 1990, 1 page.

Patent Abstract of Japan, Publication No. 05-283742, dated Oct. 29, 1993, 1 page.

* cited by examiner

LIGHT EMITTING APPARATUS

CROSS-REFERENCE TO RELATED APPLICATIONS

This application is based upon and claims the benefit of priority from the prior Japanese Patent Applications No. 2005-059548, filed on Mar. 3, 2005, the entire contents of which are incorporated herein by reference.

BACKGROUND OF THE INVENTION

1. Field of the Invention

The present invention relates to a light emitting apparatus, particularly relates to a light emitting apparatus constituting a light source by a semiconductor light emitting element.

2. Description of the Related Art

In a background art, there is known a light emitting apparatus or an illuminating apparatus using a semiconductor light emitting element of LED (Light Emitting Diode) for a light source.

For example, there is an illuminating apparatus constituting an LED module by mounting an LED bare chip on a board and making the LED bare chip emit light by supplying power from a power supply source to the LED module (See JP-A-2004-253364.).

Figure 13:
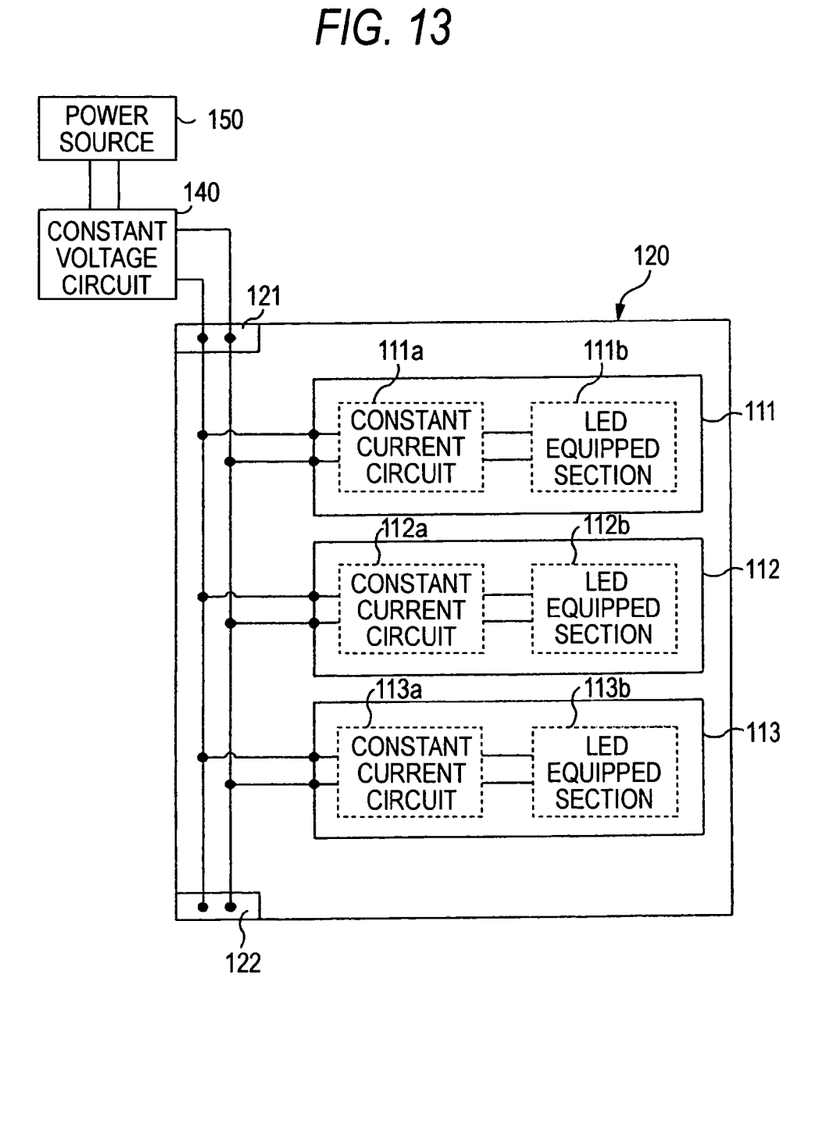
FIG. 13 is a block diagram of an illuminating apparatus of a background art.

According to the illuminating apparatus, as shown by FIG. 13, LED modules 111, 112, 113 including constant current circuit portions 111a, 112a, 113a and LED mounting portions 111b, 112b, 113b mounted with a plurality of LED bare chips are respectively mounted to a module socket 120, the respective LED modules 111, 112, 113 are connected to a constant voltage unit 140 by way of a connector 121, the constant voltage circuit unit 140 is connected to a power supply source 150, and power from the power supply source 150 is supplied to the respective LED bare chips of the LED modules 111, 112, 113 by way of the constant voltage circuit unit 140 and the connector 121. According to the illuminating apparatus, the constant current circuit portions 111a, 112a, 113a are mounted to the respective LED modules 111, 112, 113 and therefore, a light emitting intensity of the LED bare chip in driving to emit light can be stabilized, further, when other module socket 120 is arranged contiguous to the module socket 120, by connecting the module sockets 120 by way of a connector 122, the LED module can easily be expanded.

JP-A-2004-253364 (page 4 through page 8, FIG. 1, FIG. 2, FIG. 3) is referred to as a related art.

Although according to the background art, portions of electric parts and optical parts are integrally mounted to the respective LED modules 111, 112, 113, the LED modules 111, 112, 113 and the constant voltage circuit unit 140 are arranged separately from each other and therefore, a wiring operation for connecting the both members by wirings is needed. Further, the electric circuit parts constituting the constant voltage circuit unit 140 are exposed and therefore, the electric circuit parts are liable to be influenced in accordance with a change in an environment, which does not sufficiently promote reliability.

SUMMARY OF THE INVENTION

In one or more embodiments of the present invention an electric part and an optical part are mounted on the same board to reduce wirings and promote reliability of a mounted part.

In one or more embodiments of the present invention, a light emitting apparatus according to a first embodiment of the present invention is constructed by a constitution in which a semiconductor light emitting element mounted on a circuit board, a lighting circuit part mounted on the circuit board, and a cover which covers the semiconductor light emitting element and the lighting circuit part, wherein the lighting circuit part converts a voltage inputted from a power source into electromagnetic energy and propagates the converted electromagnetic energy to the semiconductor light emitting element as light emitting energy, and the cover transmits light from the semiconductor light emitting element.

The semiconductor light emitting element and the lighting circuit part are integrally mounted on the circuit board and therefore, wirings are reduced, wiring operation is facilitated, the semiconductor light emitting element and the lighting circuit part are covered by the cover and therefore, a mounted part of the semiconductor light emitting element or the like can be prevented from being deteriorated by a change in an environment.

The light emitting apparatus according to a second embodiment of the present invention is constructed by a constitution in which a plurality of electrodes which are mounted on the circuit board, and apply the voltage from the power source to the lighting circuit part, wherein the plurality of electrodes are arranged at positions deviated from the cover to be exposed, in the light emitting apparatus described in the first embodiment.

The plurality of electrodes are mounted on the circuit board, the respective electrodes are exposed at positions deviated from the cover and therefore, power can be fed to the lighting circuit part and the semiconductor light emitting element by only applying the voltage from the power source to the respective electrodes.

The light emitting apparatus according to a third embodiment of the present invention is constructed by a constitution in which the cover integrally includes a convex lens which transmits the light from the semiconductor light emitting element, and the semiconductor light emitting element is arranged at a position deviated from the circuit from the circuit board where is on a side of the convex lens rather than the lighting circuit part, in the light emitting apparatus described in the first or second embodiments.

The cover is integrally formed with the convex lens for transmitting the light from the semiconductor light emitting element, the semiconductor light emitting element is arranged on the side of the convex lens of the lighting circuit part and therefore, the light from the semiconductor light emitting element can be irradiated to the front side of the cover without providing a reflecting mirror at a surrounding of the semiconductor light emitting element.

The light emitting apparatus according to a fourth embodiment of the present invention is constructed by a constitution in which a heat radiating structure having a mounting region where a plurality of sheets of the circuit boards are mountable, in the light emitting apparatus described in any one of the first, second, or third embodiments.

The heat radiating structure can be mounted with the plurality of sheets of circuit boards and heat generated from the mounted circuit board can be radiated by the heat radiating structure.

The light emitting apparatus according to a fifth embodiment of the present invention is constructed by a constitution in which the plurality of electrodes on the circuit board are arranged to be apart from each other and interpose the lighting circuit part therebetween, a plurality of power feeding electrodes for feeding power to the plurality of electrodes is formed to be opposed to each other on the heat radiating structure, and the circuit board is mounted attachably and detachably to and from the heat radiating structure by a power feeding support member connecting each of the electrodes on the circuit board and each of the power feeding electrodes on the heat radiating structure, in the light emitting apparatus described in the fourth embodiment.

When the circuit board is arranged on the heat radiating structure, by connecting the respective electrodes on the circuit board and the respective power feeding electrodes on the heat radiating structure by the power feeding support member, power can be fed to the mounted part on the circuit board and the circuit board can be fixed onto the heat radiating structure. Further, by removing the power feeding support member, the circuit board can be taken out from the heat radiating structure.

As is apparent from the above-described explanation, according to the light emitting apparatus according to the first embodiment of the present invention, wiring operation is facilitated and reliability of the mounted part can be promoted.

According to the second embodiment of the present invention, power can be fed to the lighting circuit part and the semiconductor light emitting element by only applying the voltage from the power source to the respective electrodes.

According to the third embodiment of the present invention, the light from the semiconductor light emitting element can be irradiated to the front side of the cover by the convex lens without providing a reflecting mirror at a surrounding of the semiconductor light emitting element.

According to the fourth embodiment of the present invention, the plurality of sheets of circuit boards can be mounted to the heat radiating structure and heat generated from the mounted circuit board can be radiated by the heat radiating structure.

According to the fifth embodiment of the present invention, power can be fed to the mounted part on the circuit board by using the feeding support member and the circuit board can be fixed attachably and detachably to and from the heat radiating structure.

DETAILED DESCRIPTION

Figure 1:
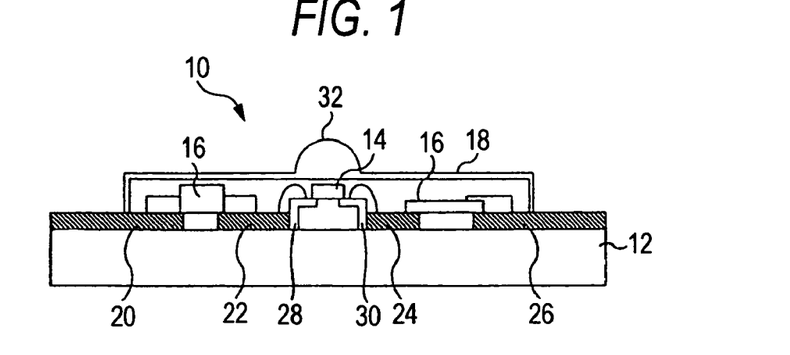
FIG. 1 is a vertical sectional view of a portion of a light emitting apparatus showing a first embodiment of the invention.
Figure 2:
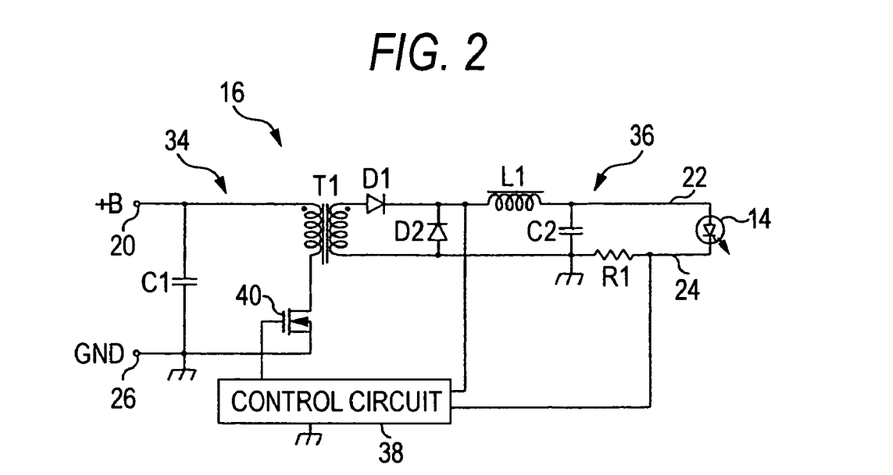
FIG. 2 is a circuit constitution diagram of the light emitting apparatus.
Figure 3:
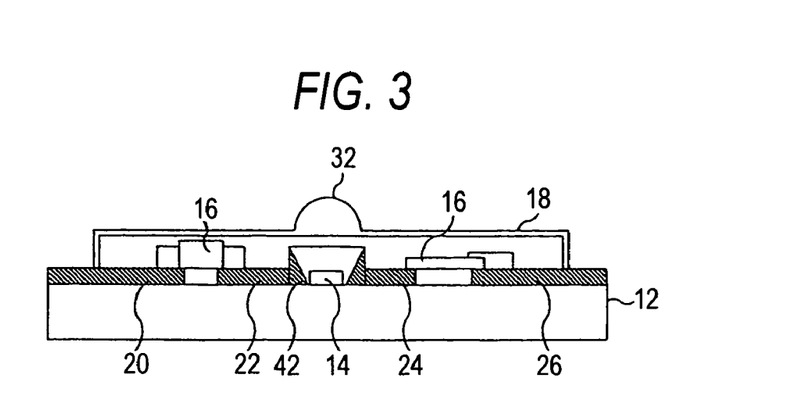
FIG. 3 is a vertical sectional view of a portion of a light emitting apparatus showing a second embodiment of the invention.
Figure 4:
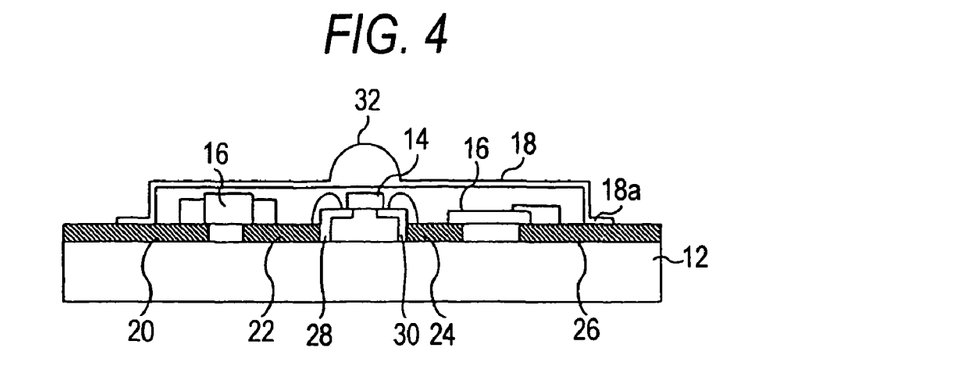
FIG. 4 is a vertical sectional view of a portion of a light emitting apparatus showing a third embodiment of the invention.
Figure 5:
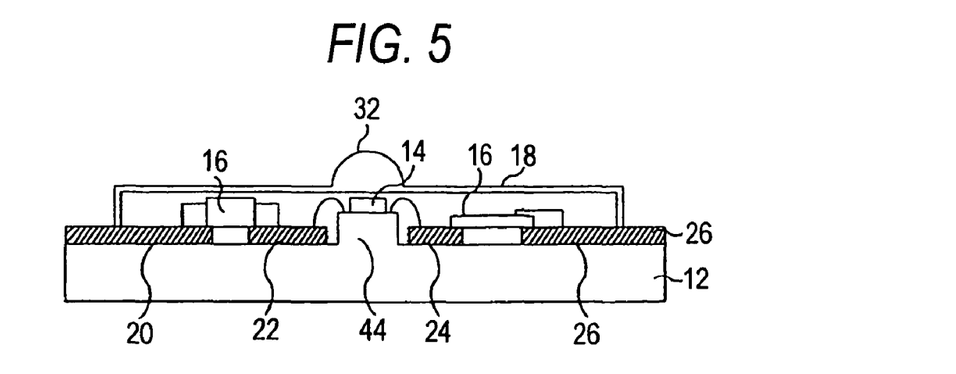
FIG. 5 is a vertical sectional view of a portion of a light emitting apparatus showing a fourth embodiment of the invention.
Figure 6:
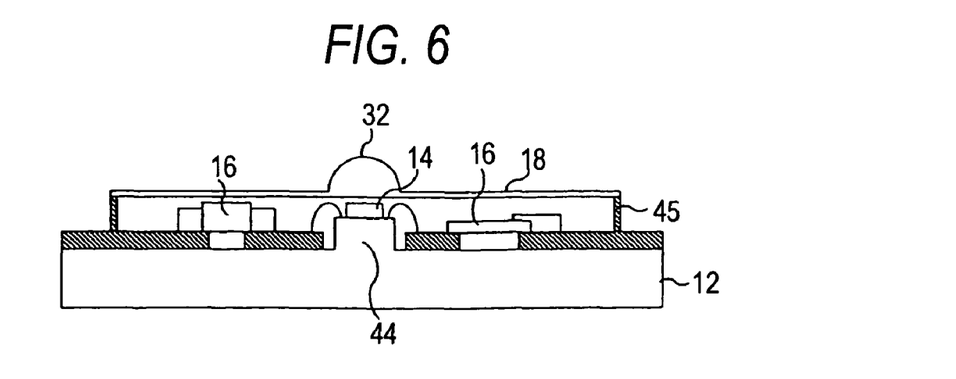
FIG. 6 is a vertical sectional view of a portion of a light emitting apparatus showing a fifth embodiment of the invention.
Figure 7:
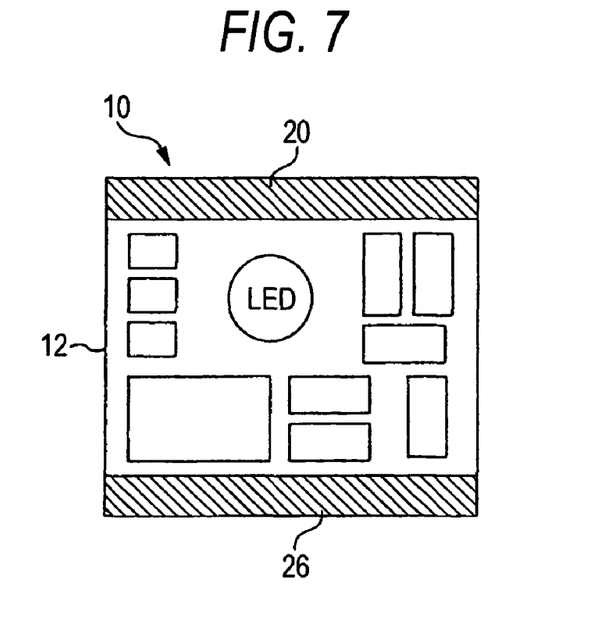
FIG. 7 is a plane view showing an embodiment of a light emitting apparatus.
Figure 8:
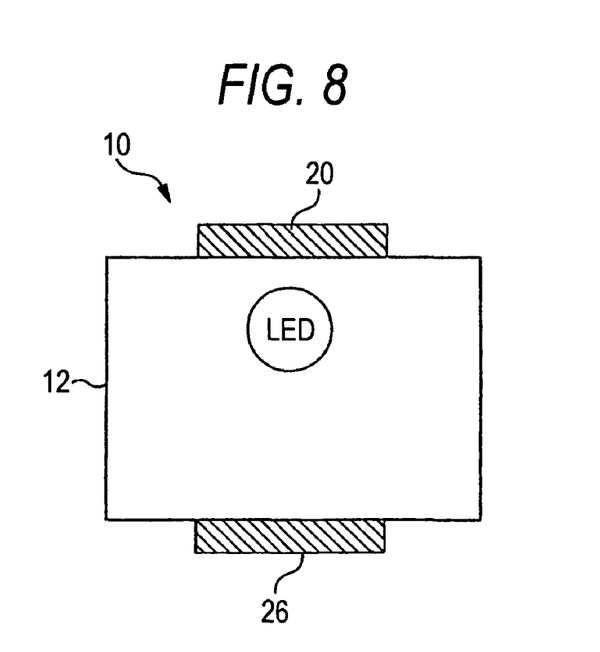
FIG. 8 is a plane view showing another embodiment of a light emitting apparatus.
Figure 9:
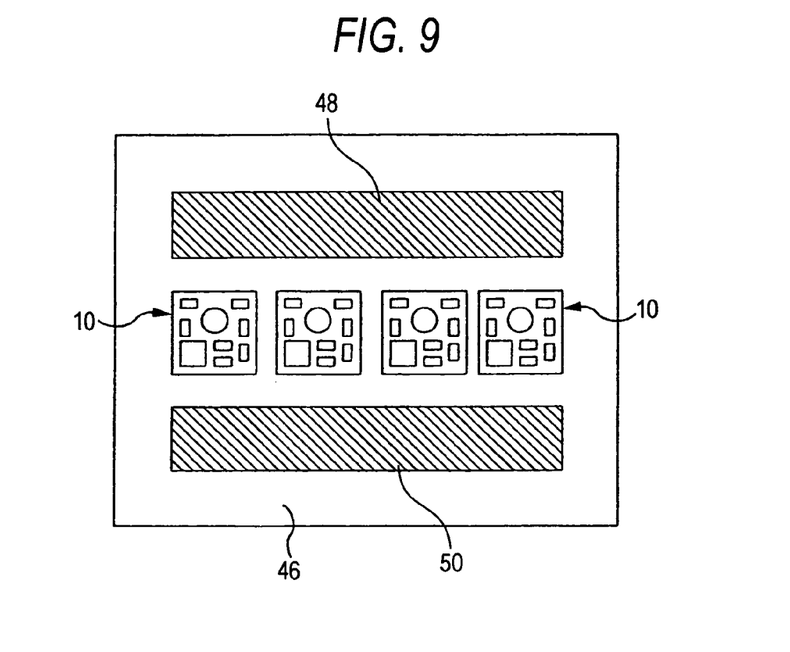
FIG. 9 is a plane view when a light emitting apparatus is mounted to a heat radiating structure.
Figure 10:
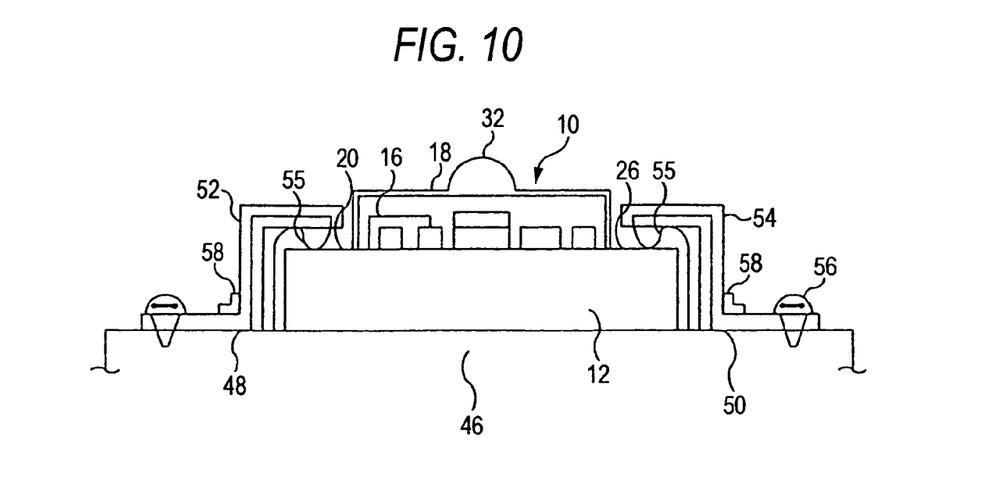
FIG. 10 is a side view enlarging a portion when the light emitting apparatus is mounted to the heat radiating structure.
Figure 11A:
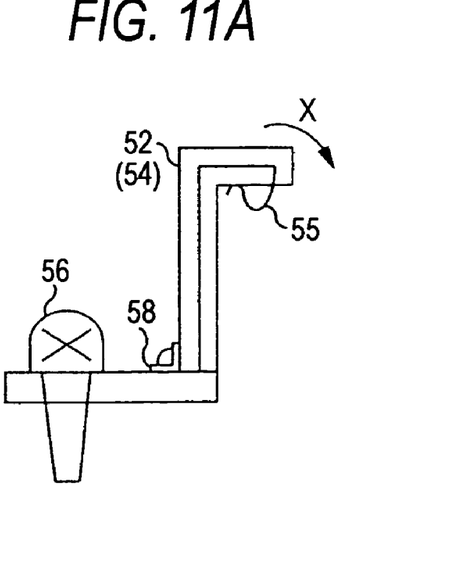
FIGS. 11A and 11B illustrate side views enlarging a portion for explaining a method of operating a power feeding support member.
Figure 11B:
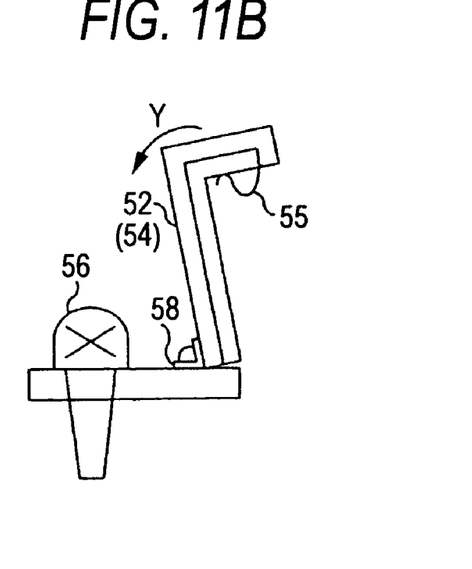
Figure 12:
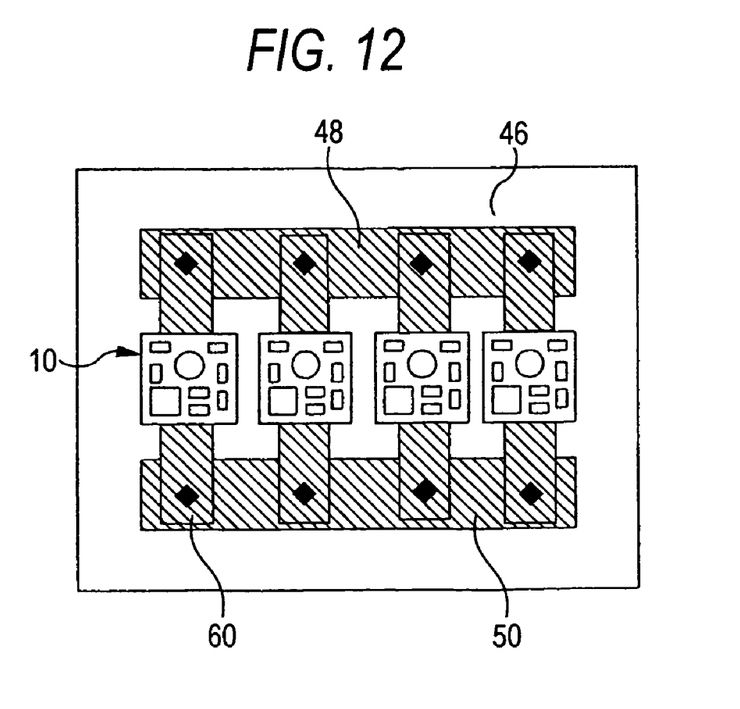
FIG. 12 is a plane view showing another embodiment when a light emitting apparatus is mounted to a heat radiating structure.

Next, a mode for carrying out embodiments of the invention will be explained with reference to the figures. FIG. 1 is a vertical sectional view of a portion of a light emitting apparatus showing an embodiment of the invention, FIG. 2 is a circuit constitution diagram of a lighting circuit used in the light emitting apparatus, FIG. 3 is a vertical sectional view of a portion of a light emitting apparatus showing a second embodiment of the invention, FIG. 4 is a vertical sectional view of a portion of a light emitting apparatus showing a third embodiment of the invention, FIG. 5 is a vertical sectional view of a portion of a light emitting apparatus showing a fourth embodiment of the invention, FIG. 6 is a vertical sectional view of a portion of a light emitting apparatus showing a fifth embodiment of the invention, FIG. 7 is a plane view showing an embodiment of a light emitting apparatus, FIG. 8 is a plane view showing another embodiment of a light emitting apparatus, FIG. 9 is a plane view when a light emitting apparatus is mounted to a heat radiating structure, FIG. 10 is a side view enlarging a portion when the light emitting apparatus is mounted to the heat radiating structure, FIGS. 11A and 11B illustrate side views enlarging a portion for explaining a method of operating a power feeding support member, and FIG. 12 is a plane view showing another embodiment when a light emitting apparatus is mounted to a heat radiating structure.

In the drawings, as shown by FIG. 1, a light emitting apparatus 10 is constituted by including a metal made circuit board 12, an LED chip 14 as a semiconductor light emitting element, a lighting circuit part 16 for controlling lighting of the LED chip 14, and a resin made cover 18 as an element of a vehicular lamp piece. Further, the cover 18 may be constituted by a material made of glass.

The circuit board 12 is formed substantially in a shape of a parallelepiped using a metal and circuit patterns 20, 22, 24, 26 and the like are formed on the circuit board 12. The circuit pattern 20 is connected to a positive terminal of a power source as an electrode and the circuit pattern 26 is connected to a negative terminal of the power source as an electrode. The lighting circuit part 16 is mounted on the respective circuit patterns 20 through 26, and in the circuit patterns 20 through 26, between the circuit pattern 22 and the circuit pattern 26, heat radiating bases 28, 30 formed by aluminum nitride or the like are mounted to be opposed to each other. The LED chip 14 is mounted on the respective heat radiating bases 28, 30 by die bonding. Both end sides of the LED chip 14 are respectively connected to the circuit patterns 22, 24, and power is supplied to the LED chip 14 by way of the lighting circuit parts 16 when a voltage is applied to the circuit patterns 20, 26.

The cover is formed substantially in a shape of a parallelepiped using a resin as a hermetically sealed vessel constituting a front face cover or a front face lens. According to the example, a convex lens 32 is formed at substantially a center portion so as to be opposed to the LED chip 14. The cover 18 only exposes portions of the circuit patterns 20, 26 as the electrodes and covers mounted parts of the lighting circuit part 16, the LED chip 14 or the like to hermetically sealed and therefore, a surrounding thereof is adhered to the circuit patterns 20, 26 or the like of the circuit board 12. The convex lens 32 is arranged above the LED chip 14 to be proximate to the LED chip 14 and when the LED chip 14 emits light, the convex lens 32 converges light in accordance with the light emission and transmits the converged light to be irradiated to a front side of the cover 18. That is, the convex lens 32 is formed in a semispherical shape and therefore, the convex lens 32 can transmit light from the LED chip 14 as it is to be irradiated to the front side without reflecting the light and an adverse influence on distribution of light and a reduction in an optical efficiency can be prevented.

The lighting circuit part 16 is constituted by including a switching regulator 34, a rectifying and smoothing circuit 36, and a control circuit 38. The switching regulator 34 includes a transformer T1, a capacitor C1, and an NMOS transistor 40, one end side of a primary winding of the transformer T1 is connected to the circuit pattern 20, the other end side of the primary winding is connected to the circuit pattern 26 by way of the NMOS transistor 40 and is grounded. A gate of the NMOS transistor 40 is connected to the control circuit 38 and the NMOS transistor 40 is operated to ON/OFF in response to a switching signal from the control circuit 38. Further, in accordance with the ON/OFF operation of the NMOS transistor 40, an input voltage applied to the circuit patterns 20, 26 is accumulated at the transformer T1 as an electromagnetic energy and the accumulated electromagnetic energy is discharged to the rectifying and smoothing circuit 36. The rectifying and smoothing circuit 36 is constituted by including diodes D1, D2 as rectifying elements for propagating the electromagnetic energy discharged from a secondary side of the transformer T1 to the LED chip 14 as a light emitting energy and including a coil A1 and a capacitor C2 as smoothing elements. One end side of the capacitor C2 is connected to the LED chip 14 by way of the circuit pattern 22 and the other end side of the capacitor C2 is connected to the LED chip 14 by way of a resistor R1 and the circuit pattern 24. A voltage generated across both ends of the resistor R1 is inputted to the control circuit 38, the control circuit 38 inputs cathode common voltages of the diodes D1, D2 and the voltage generated across the both ends of the resistor R1 and controls the ON/OFF operation of the NMOS transistor 40 based on the inputted voltage.

According to the embodiment shown, the lighting circuit part 16 and the LED chip 14 as electric parts are integrally mounted on the circuit board 12 covered by the cover 18 as an optical part. When a voltage is applied to the circuit patterns 20, 26, the LED chip 14 emits light. Therefore, wiring operation in integration is not needed, and operation cost can be reduced. Thus, the lighting circuit part 16 and the LED chip 14 can be prevented from being deteriorated in accordance with a change in an environment, which can contribute to the promotion of reliability.

Next, a second embodiment of the invention will be explained with reference to FIG. 3. According to the embodiment shown, the heat radiating bases 28, 30 shown in FIG. 1 are removed from the circuit board 12, the LED chip 14 is directly mounted on the circuit board 12, and a reflecting mirror 42 is provided at a surrounding of the LED chip 14. Other parts are similar to those of FIG. 1.

According to the embodiment shown, the LED chip 14 is directly mounted on the circuit board 12, the LED chip 14 and the convex lens 32 are arranged to be remote from each other, light by light emission of the LED chip 14 is reflected by the reflecting mirror 42 and is converged to the convex lens 32 and therefore, light by light emission of the LED chip 14 can be irradiated from the convex lens 32 to the front side of the cover 18 by way of the reflecting mirror 42.

According to the embodiment shown, wiring operation in integration is not needed, and operation cost can be reduced. Thus, the lighting circuit part 16 and the LED chip 14 can be prevented from being deteriorated in accordance with a change in an environment, which can contribute to the promotion of reliability. Further, even when the LED chip 14 is mounted directly on the circuit board 12, light by light emission of the LED chip 14 can be irradiated to the front side of the cover 18.

Next, a third embodiment of the invention will be explained with reference to FIG. 4. According to the embodiment shown, a seal margin 18*a* is provided at an end portion in an opening side of the cover 18, the seal margin 18*a* of the cover 18 is fixedly attached onto the circuit board 12 and other parts are similar to those of FIG. 1.

According to the embodiment shown, the cover 18 is fixedly attached onto the circuit board 12 by way of the seal margin 18*a* and therefore, the cover 18 and the circuit board 12 are further firmly brought into close contact each other. Thus, airtightness can be promoted and an electric circuit part can further firmly be prevented from being deteriorated by a change in humidity.

According to the embodiment shown, wiring operation in integration is not needed, and operation cost can be reduced. Thus, the lighting circuit part 16 and the LED chip 14 can be prevented from being deteriorated in accordance with a change in an environment and reliability can be promoted.

Next, a fourth embodiment of the invention will be explained with reference to FIG. 5. According to the embodiment shown, a center portion of the circuit board 12 is integrally formed with a heat radiating base 44 in place of the heat radiating bases 28, 30 shown in FIG. 1, the LED chip 14 is mounted on the heat radiating base 44 and other parts are similar to those of FIG. 1.

According to the embodiment shown, the circuit board 12 is integrally formed with the heat radiating base 44 and therefore, a number of parts can be reduced. Further, a thermal resistance can be made to be smaller than that in a case of separately providing the heat radiating base 44 and heat generation of the LED chip 14 can be restrained.

According to the embodiment shown, wiring operation in integration is not needed, and operation cost can be reduced. Thus, the lighting circuit part 16 and the LED chip 14 can be prevented from being deteriorated in accordance with a change in an environment, which can contribute to the promotion of reliability. Further, a number of parts can be reduced.

Next, a fifth embodiment of the invention will be explained with reference to FIG. 6. According to the embodiment shown, the cover 18 is formed substantially in a flat plate shape, a surrounding of the cover 18 is fixedly attached to a lens holder 45 in a cylindrical shape, a bottom portion side of the lens holder 45 is fixedly attached onto the circuit board 12 and other parts are similar to those of FIG. 5.

According to the embodiment shown, by forming the lens holder 45 in accordance with a height of the lighting circuit part 16, the cover 18 can be made to be common regardless of a size of the lighting circuit part 16.

According to the embodiment shown, wiring operation in integration is not needed, and operation cost can be reduced. Thus, the lighting circuit part 16 and the LED chip 14 can be prevented from being deteriorated in accordance with a change in an environment, which can contribute to the promotion of reliability. Further, the cover 18 can be made to be common regardless of the size of the lighting circuit part 16.

In constituting the light emitting apparatus 10 in the respective embodiments, as shown by FIG. 7, there can be adopted a constitution of arranging the circuit patterns 20, 26 as the electrodes on both end sides of the circuit board 12 to be remote from each other by interposing the circuit pattern 26 therebetween, or as shown by FIG. 8, there can be adopted a constitution of forming the circuit patterns 20, 26 as the electrodes at the portions of the both end sides of the circuit board 12. Further, the lighting circuit part 16 can also be fixed by filling a resin inside of the cover 18.

Next, an explanation will be given of an embodiment when a plurality of the light emitting apparatus 10 are aligned at a heat radiating structure. In FIG. 9, a heat radiating structure 46 is formed substantially in a shape of a parallelepiped using aluminum. According to the heat radiating structure 46, a surface thereof is provided with a mounting region capable of mounting a plurality of sheets of the circuit boards 12 for mounting a plurality of the light emitting apparatus 10 and a plurality of power feeding electrodes 48, 50 are formed to be opposed to each other in parallel.

As shown by FIG. 10, the respective power feeding electrodes 48, 50 can be fixed with power feeding support members 52, 54 by screws 56, and a distance between the power feeding electrode 48 and the power feeding electrode 50 is set to be larger than a width of the circuit board 12. The power feeding support members 52, 54 include conductive materials 55 and formed substantially in a Z-like shape and bottom portion sides thereof are openably and closably provided with hinges 58. When the plurality of light emitting apparatus 10 are arranged on the heat radiating structure 46, the power feeding support member 52 connects the power feeding electrode 48 and the circuit pattern 20 and the supporting member 54 connects the power feeding electrode 50 and the circuit pattern 26.

Specifically, when the plurality of light emitting apparatus 10 are arranged on the heat radiating structure 46, as shown by FIG. 11A, the respective light emitting apparatus 10 can be fixed onto the heat radiating structure 46 by fixing the respective support members 52, 54 respectively to the power feeding electrodes 48, 50 by the screws 56 and thereafter operating the respective support members 52, 54 in the X direction (closing direction), the power feeding electrode 48 and the circuit pattern 20 can be connected, and the power feeding electrode 50 and the circuit pattern 26 can be connected. Further, the heat radiating structure 46 can sufficiently radiate heat generated from the respective light emitting apparatus 10.

On the other hand, when the respective support members 52, 54 are operated in the Y direction (opening direction) as shown by FIG. 11B, the respective light emitting apparatus 10 can be removed from the heat radiating structure 46. That is, the respective support members 52, 54 can mount the respective light emitting apparatus 10 attachably and detachably to and from the heat radiating structure 46.

According to the embodiment shown, the plurality of light emitting apparatus 10 can be mounted attachably and detachably to and from the heat radiating structure 46 and an electric part can be prevented from being deteriorated in accordance with a temperature rise of the respective light emitting apparatus 10.

Further, according to the embodiment shown, the conductive material 55 is provided with an elasticity and therefore, the light emitting apparatus 10 can firmly be fixed onto the heat radiating structure 46 and power supplied to the power feeding electrodes 48, 50 can firmly be supplied to the respective light emitting apparatus 10.

Although according to the embodiment shown, a description has been given of the constitution of aligning 4 of the light emitting apparatus 10 in one row on the heat radiating structure 46, an arbitrary number of the light emitting apparatus 10 can be mounted on the heat radiating structure 46 by adjusting a size of the heat radiating structure 46.

Further, when the power feeding electrodes 48, 50 are respectively formed in a U-like shape and the power feeding electrodes 48, 50 in the U-like shape are arranged in parallel, the light emitting apparatus 10 can also be arranged in two rows along the respective power feeding electrodes 48, 50.

Further, the respective light emitting apparatus 10 are mounted with switching regulators and therefore, a switching regulator inputted with AC100V can be used.

Further, the LED chips 14 mounted to the respective light emitting apparatus 10 having different Vf (forward voltages) or having different colors can also be used.

According to the embodiment shown, the supporting members 52, 54 including the hinges 58 are used and therefore, when the respective light emitting apparatus 10 are mounted on the heat radiating structure 46, the respective light emitting apparatus 10 can be inserted from above the heat radiating structure 46 to be fixed without respectively sliding the respective light emitting apparatus 10.

Further, as shown by FIG. 12, in place of using the support members 52, 54, there can be adopted a constitution of using a conductive plate 60, welding both end sides of the conductive plates 60 respectively to the power feeding electrodes 48, 50 on the heat radiating structure 46 and the circuit patterns 20, 26 on the circuit board 12 to connect the power feeding electrode 48 and the circuit pattern 20 by the conductive plate 60 and connect the power feeding electrode 50 and the circuit pattern 26 by the conductive plate 60.

What is claimed is:

1. A light emitting apparatus, comprising:
   a semiconductor light emitting element mounted on a circuit board;
   a lighting circuit part mounted on the circuit board; and
   a cover which completely covers the semiconductor light emitting element and the lighting circuit part, wherein
   the cover transmits light from the semiconductor light emitting element, and
   the cover integrally includes a plano-convex lens which transmits the light from the semiconductor light emitting element, and the semiconductor light emitting element is arranged at a position apart from the circuit board, and on a side of the plano-convex lens rather than a side of the lighting circuit part.

2. The light emitting apparatus according to claim 1, further comprising: a plurality of electrodes which are mounted on the circuit board, and apply the voltage from the power source to the lighting circuit part, wherein the plurality of electrodes are arranged at positions exterior to the cover so as to be exposed.

3. The light emitting apparatus according to claim 2, further comprising: a heat radiating structure having a mounting region where a plurality of sheets of the circuit boards are mountable.

4. The light emitting apparatus according to claim 3, wherein the plurality of electrodes on the circuit board are arranged to be apart from each other and interpose the lighting circuit part therebetween, a plurality of power feeding electrodes for feeding power to the plurality of electrodes is formed to be opposed to each other on the heat radiating structure, and the circuit board is mounted attachably and detachably to and from the heat radiating structure by a power feeding support member connecting each of the electrodes on the circuit board and each of the power feeding electrodes on the heat radiating structure.

5. The light emitting apparatus according to claim 1, wherein the cover hermetically seals the semiconductor light emitting element and the lighting circuit part mounted to a portion of the circuit board.

6. A light emitting apparatus, comprising:
- a semiconductor light emitting element mounted on a circuit board;
- a lighting circuit part mounted on the circuit board; and
- a cover which completely covers the semiconductor light emitting element and the lighting circuit part, wherein
  - the cover transmits light from the semiconductor light emitting element,
  - the cover is hermetically-sealed vessel and is formed in substantially a rectangular parallelepiped shape, and
  - a plano-convex lens is formed substantially at a center portion of the cover so as to oppose to the semiconductor light emitting element.

7. The light emitting apparatus according to claim 6, wherein a seal margin is provided at an end portion in an opening side of the cover and is fixedly attached onto the circuit board.

8. The light emitting apparatus according to claim 6, wherein a heat radiating base is provided in a center portion of the circuit board.

9. A light emitting apparatus, comprising:
- a semiconductor light emitting element mounted on a circuit board;
- a lighting circuit part mounted on the circuit board; and
- a cover which completely covers the semiconductor light emitting element and the lighting circuit part, wherein
  - the cover transmits light from the semiconductor light emitting element,
  - the cover is hermetically-sealed vessel and is formed in substantially a rectangular parallelepiped shape, and
  - a plano-convex lens is formed substantially at a center portion of the cover so as to oppose to the semiconductor light emitting element,
- wherein the cover is formed substantially in a flat shape,
- wherein a circumference of the cover is fixedly attached to a lens holder formed in a cylindrical shape, and
- wherein a bottom portion of said lens holder is fixedly attached onto the circuit board.

* * * * *